United States Patent
Raghunandran

(10) Patent No.: US 7,149,995 B2
(45) Date of Patent: Dec. 12, 2006

(54) GRAPHICAL INTERFACE TO LAYOUT PROCESSING COMPONENTS AND CONNECTIONS

(75) Inventor: Makaram Raghunandran, Northboro, MA (US)

(73) Assignee: Intel Corporation, Santa Clara, CA (US)

( * ) Notice: Subject to any disclaimer, the term of this patent is extended or adjusted under 35 U.S.C. 154(b) by 235 days.

(21) Appl. No.: 10/877,271

(22) Filed: Jun. 25, 2004

(65) Prior Publication Data
US 2005/0289495 A1  Dec. 29, 2005

(51) Int. Cl.
*G06F 17/50* (2006.01)

(52) U.S. Cl. .......................................... 716/11; 716/12
(58) Field of Classification Search ................... 716/1, 716/11, 12, 18
See application file for complete search history.

(56) References Cited

U.S. PATENT DOCUMENTS

| 5,181,162 A * | 1/1993 | Smith et al. ................. 715/530 |
| 2004/0249822 A1* | 12/2004 | Keohane et al. ............ 707/100 |

* cited by examiner

*Primary Examiner*—Thuan Do
(74) *Attorney, Agent, or Firm*—Buckley, Maschoff & Talwalkar LLC

(57) ABSTRACT

According to some embodiments, a graphical interface is provided to facilitate the layout of processing components and connections.

26 Claims, 10 Drawing Sheets

GRAPHICAL INTERFACE TO LAYOUT PROCESSING COMPONENTS AND CONNECTIONS

BACKGROUND

A system architect may design a processing system by selecting a group of processing components and connecting some of the components together. For example, an interface of a processor might be connected to the interfaces of two memory units. In some cases, a particular interface of one component should not be connected to a particular interface of another component. For example, a 4-bit wide output interface of a processor might not be compatible with a 6-bit wide output of a memory unit (e.g., because the interfaces have different widths and because both interfaces are outputs). As a result, it possible that a processing system designed by a system architect will include errors.

DETAILED DESCRIPTION

A system designer or architect may design a "processing system." As used herein, the phrase "processing system" may refer to, for example, a network processor, a processor blade, a switching engine, and/or an optical device.

A processing system may include a number of different "processing components." As used herein, the phrase "processing component" may refer to, for example, a microprocessor, such as an INTEL® Architecture (IA) processor, an INTEL® IXP processor, or an INTEL® Xscale processor. As another example, a processing component might comprise an interface unit, such as a switch fabric interface, a packet framer, or Peripheral Component Interconnect (PCI) device, a PCI-X device, a PCI Express device, or a PCI Express Advanced Switching (AS) device.

Another example of a processing component is a memory unit, such as a Static Random Access Memory (SRAM) unit, a Dynamic Random Access Memory (DRAM) unit, a Rambus DRAM (RDRAM) unit, a Double Data Rate (DDR) DRAM unit, a Quad Data Rate (QDR) SRAM unit, a Content Addressable Memory (TCAM) device, or a Ternary Content Addressable Memory (TCAM) device. The phrase processing component may also refer to a custom designed device, such as an Application Specific Integrated Circuit (ASIC). According to some embodiments, a processing component may also refer to a group of related components.

A processing component may be associated with an interface through which it exchanges information with other components in a processing system and/or with other devices (e.g., external to the processing system). By way of example, an interface might be a single-pin or multi-pin interface associated with a memory unit or a system bus (e.g., a front side bus). As other examples, an interface might be associated with a Common Switch Interface (CSIX), a serial or parallel Small Computer Systems Interface (SCSI), a System Packet Interface (SPI) 3 or 4, or a PCI interface as defined by the PCI Standards Industry Group (SIG) standard entitled "PCI Express 1.0" (2002). Other examples of processing components include general purpose processors, chipsets, layer 2 switches, layer 3 switches, CAM devices, TCAM devices, and network processors.

Figure 1:
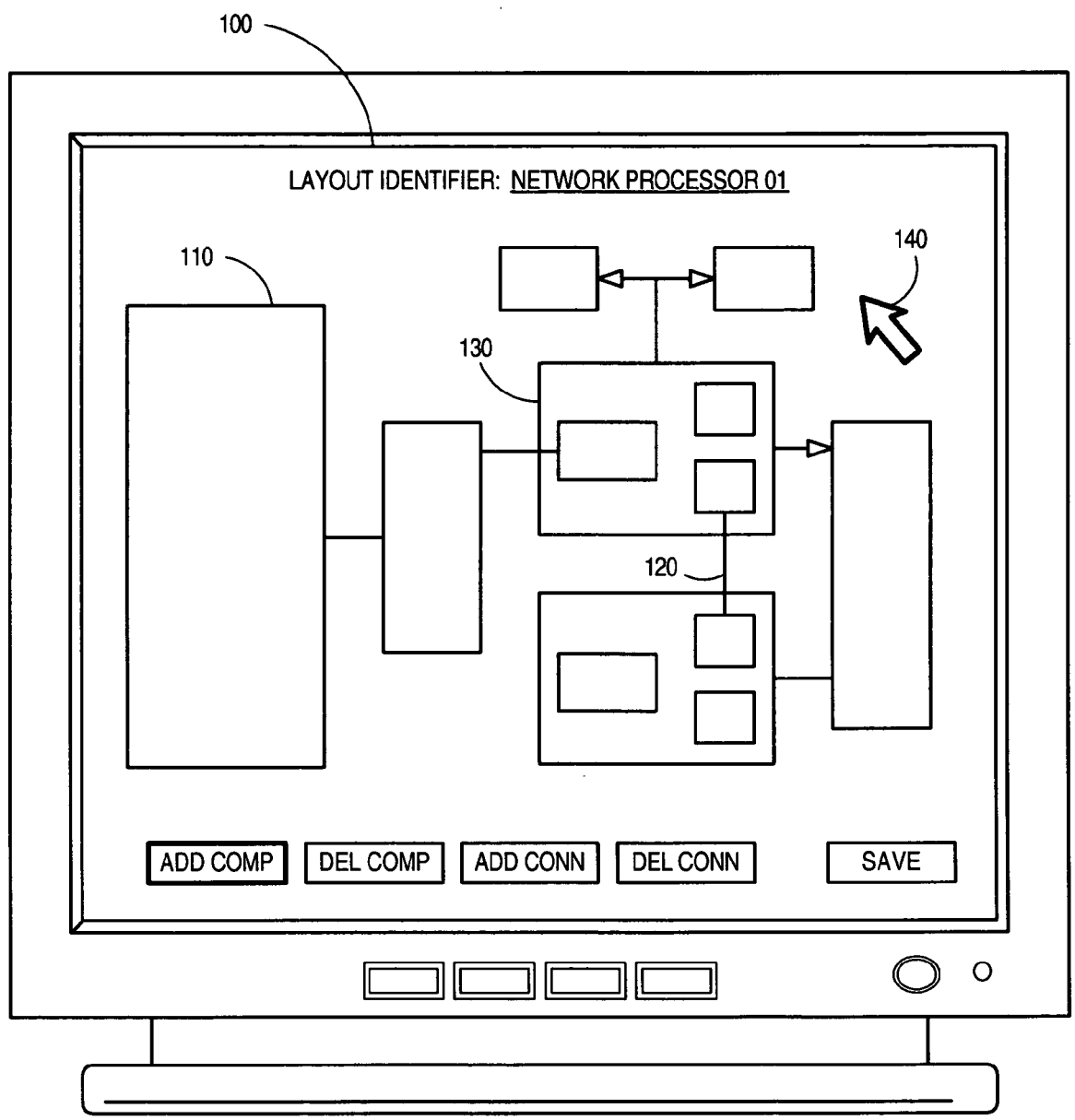
FIG. 1 illustrates a display according to some embodiments.

A processing system design may include connections between processing component interfaces. For example, an interface associated with a processor might be connected to an interface associated with a memory unit. According to some embodiments, a Graphical User Interface (GUI) is provided to facilitate the definition of such connections. For example, FIG. 1 illustrates a display 100 according to some embodiments. The display 100 includes graphical representations of a number of processing components 110 and connections 120 between those components 110. Note that in some cases a connection may be provided to, or within, a group 130 of components 110. The collection of components 110, connections 120, and component groups 130 comprise a block diagram or "layout" that represents the processing system.

A system architect may use the display 100 to add a new component 110 to the layout. For example, he or she may activate an "ADD COMP" icon and position a new component 110 within the layout using a pointer 140. An architect might also delete a component 110 ("DEL COMP").

According to some embodiments, an architect may also use the display 100 to define a connection 120 between components 110. For example, he or she may activate an "ADD CONN" icon and use the pointer 140 to "draw" the connection 120 between two (or more) components 110. An architect might also delete a connection 120 or modify an existing connection (e.g., by graphically dragging one end of a connection 120 from one component 110 to another component 110).

In this way, an architect can efficiently design a processing system using the GUI display 100. Moreover, according to some embodiments, information associated with the layout can be stored (e.g., by activating a "SAVE" icon) and subsequently retrieved (e.g., to be used for another processing system and/or by another architect).

Figure 2:
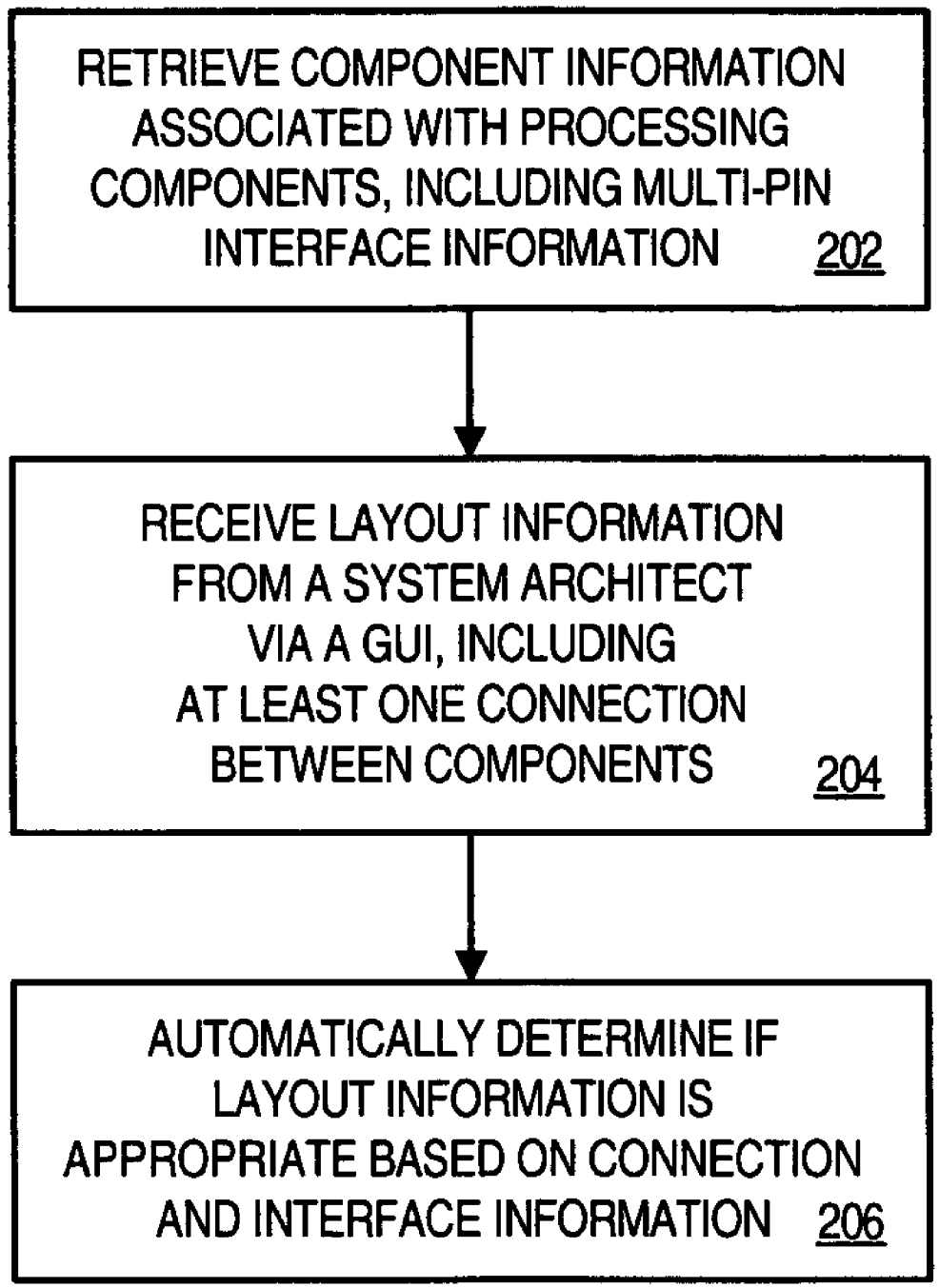
FIG. 2 is a flow chart of a method according to some embodiments.

FIG. 2 is a flow chart of a method that may be performed, for example, in connection with the display 100 illustrated in FIG. 1. The flow charts described herein do not necessarily imply a fixed order to the actions, and embodiments may be performed in any order that is practicable. Note that any of the methods described herein may be performed by hardware, software (including microcode), firmware, or any combination of these approaches. For example, a storage medium may store thereon instructions that when executed by a machine result in performance according to any of the embodiments described herein.

At 202, component information associated with processing components is retrieved. For example, an architect might activate an "ADD COMP" icon to indicate that he or she would like to add a processing component to a particular layout. In this case, information about a component might be retrieved from a component database (e.g. after he or she indicates which component is to be added to the layout). The component information might include, for example, a component identifier, a component type, and/or information about the component's graphical representation (e.g., the color and size of the representation).

According to some embodiments, the component information also includes multi-pin interface information associated with at least one of the components. The interface information might be associated with, for example, an interface channel or an interface bus and may include an interface identifier, an interface type, an interface speed, and/or an interface width (e.g., a number of pins associated with the interface). The interface information might also include an interface direction indicating that the component uses the interface to receive data, to transmit data, or that that the interface is bi-directional (e.g., is used to both receive and transmit data). The interface information might also include interface load information (e.g., indicating how many other components may be coupled to the interface) and/or mode information (e.g., when the interface can operate in a number of different modes).

At 204, layout information is received from a system architect via a graphical interface. The layout information might include, for example, a layout type (e.g., describing the purpose of the processing system), a layout name (e.g., "Network_Processor_01"), and/or location information associated with processing components. Note that the location information might indicate a physical location (e.g., a position on a board) and/or a graphical location (e.g., a position on a display).

According to some embodiments, the layout information includes at least one connection between the processing components. For example, the layout information might indicate that a particular interface of a processor is coupled to a particular interface of an SRAM unit.

At 206, it is automatically determined if the layout information is appropriate (e.g., by determining whether or not the information is valid) based on the connection and the interface information. For example, a layout manager (e.g., a software application, a server, and/or any other type of device) might compare interface information associated with one component with interface information associated with another component to determine if a particular connection between those components is valid. According to some embodiments, a batch of connections associated with a layout are evaluated (e.g., when the layout information is saved to a file). According to other embodiments, potential connections are evaluated as they are added to a layout (e.g., an architect might be prevented from adding a particular connection because the component interfaces are of different, incompatible types). According to some embodiments, a layout is determined to be invalid when at least one component interface is unconnected (e.g., the architect has failed to connect the interface to another component). In this way, the likelihood of errors in a block diagram or layout may be reduced.

Figure 3:
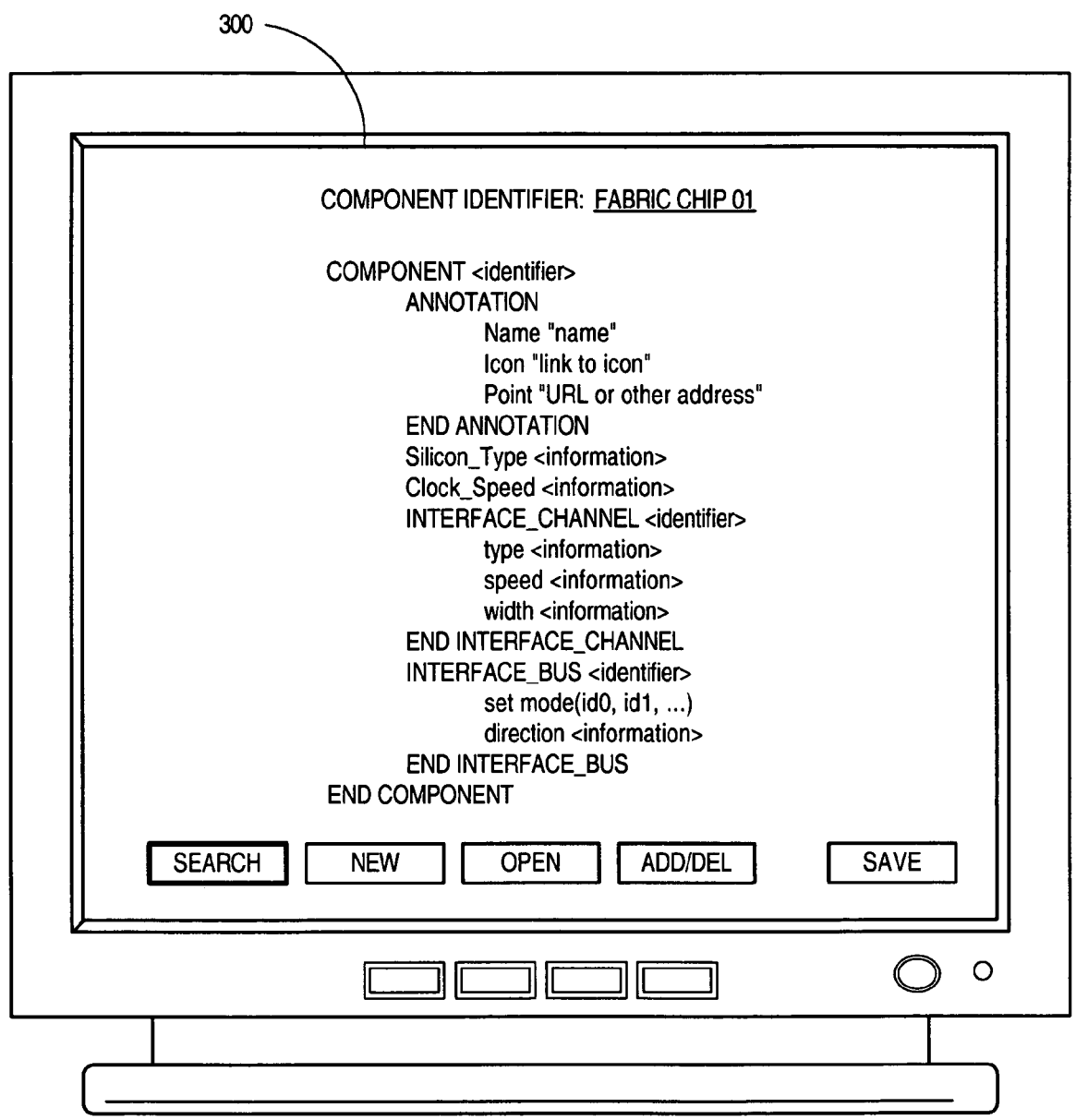
FIG. 3 illustrates a component definition display according to some embodiments.

FIG. 3 illustrates a component definition display 300 according to some embodiments. The display 300 might be used, for example, by a component designer to define properties associated with a processing system component. The display 300 might also be used by a system architect to review information about an existing component.

The component definition display 300 may be used to define, for example, a component identifier, a component type, a silicon type, and/or a clock frequency associated with the component.

According to some embodiments, a component designer may use an extensible mark-up language to provide information about a component. For example, COMPONENT and END COMPONENT statements might be used to define a processing component, to assign an identifier to the component (e.g., a unique name), and to identify a silicon type (e.g., indicating that the component uses IA or is an SRAM unit). These statements may also be used to define a clock speed (e.g., a processor frequency). Note that in some cases, the clock speed may determine possible interface channel speeds.

In addition, ANNOTATION and END ANNOTATION statements may provide additional information about the component. For example, help information, a component icon (e.g., a link to a graphical representation of the component), and/or a Uniform Resource Locator (URL) address associated with the component might be provided.

As another example, the following statements might be used to define and name an SPI4 interface channel for a component:

```
INTERFACE_CHANNEL <SPI4_INT>
    type <SPI>
    speed <1.5 MHz>
    width <4 bits>
END INTERFACE_CHANNEL
```

The interface type might indicate, for example, that the interface is associated with a particular protocol. According to some embodiments, defining an interface type will automatically generate other definitions (e.g., based on the protocol). These statement might also be used to define, for example, a maximum number of loads that that can be supported by the interface (e.g., a single processor interface might be able to support four SRAM devices) and/or an amount of loading this interface will places on other connected components. According to some embodiments, a library or database of interface channels may be referenced by a number of different components and/or layouts.

Note that a single processing component may have a number of different interface channels. Moreover, multiple interface channels might be combined into a single interface bus. For example, an interface bus may consist of multiple physical protocols that are muxed together on the same physical pins (e.g., a 32-bit media switch fabric interface might support SP3 and CSIX).

Assume that a component has, in addition to the SP4_INT interface channel previously defined, the following interface channel definition:

```
INTERFACE_CHANNEL <CSIX_INT>
    type <CSIX>
    speed <2 MHz>
    width <4 bits>
END INTERFACE_CHANNEL
```

In this case, an interface bus might be defined as follows:

```
INTERFACE_BUS <IO Bus>
    set_mode (SP4_INT, CSIX_INT)
    direction <bi-directional>
END INTERFACE_BUS
```

Where the set_mode statement defines valid interface channels associated with the bus. The direction statement may indicate the direction of data transfer (e.g., Tx, Rx, or bi-directional).

According to some embodiments, the mark-up language may support a Boolean interface definition for a component. For example, a "union" statement might be used in place of the set_mode statement:

```
INTERFACE_BUS <msf_int_a>
    union (SP4_INT or CSIX_INT)
    direction <input>
END INTERFACE_BUS
INTERFACE_BUS <msf_int_b>
    union (SP4_INT and CSIX_INT)
    direction <output>
END INTERFACE_BUS
```

In this case, interface bus msf_int_a uses a Boolean "or" to indicate that the interface is able support either of the two interface channels at any given time (but not both at once). With the interface bus msf_int_b, however, a Boolean "and" indicates that the interface can support both interface channels simultaneously.

According to some embodiments, the display 300 may be used by a system architect to search for a particular component and/or type of component (e.g., by activating the "SEARCH" icon). The display 300 may also be used to enter information about a new component ("NEW"), retrieve information about an existing component ("OPEN"), and/or to add, modify, or delete components or information about components ("ADD/DEL"). The display 300 may also be used to save component information to a file ("SAVE"). According to other embodiment, the display 300 may also be used to generate a report that describes the component (e.g., via a "PRINT" icon not illustrated in FIG. 3).

Note that component information may be retrieved from a component library or database (e.g., a database that contains information associated with hundreds of different components). According to some embodiments, component information may instead be received from a remote device via a communication network (e.g., the Internet). For example, a component designer might enter information about a component and then transmit the component information to a remote database maintained by a system architect.

Figure 4:
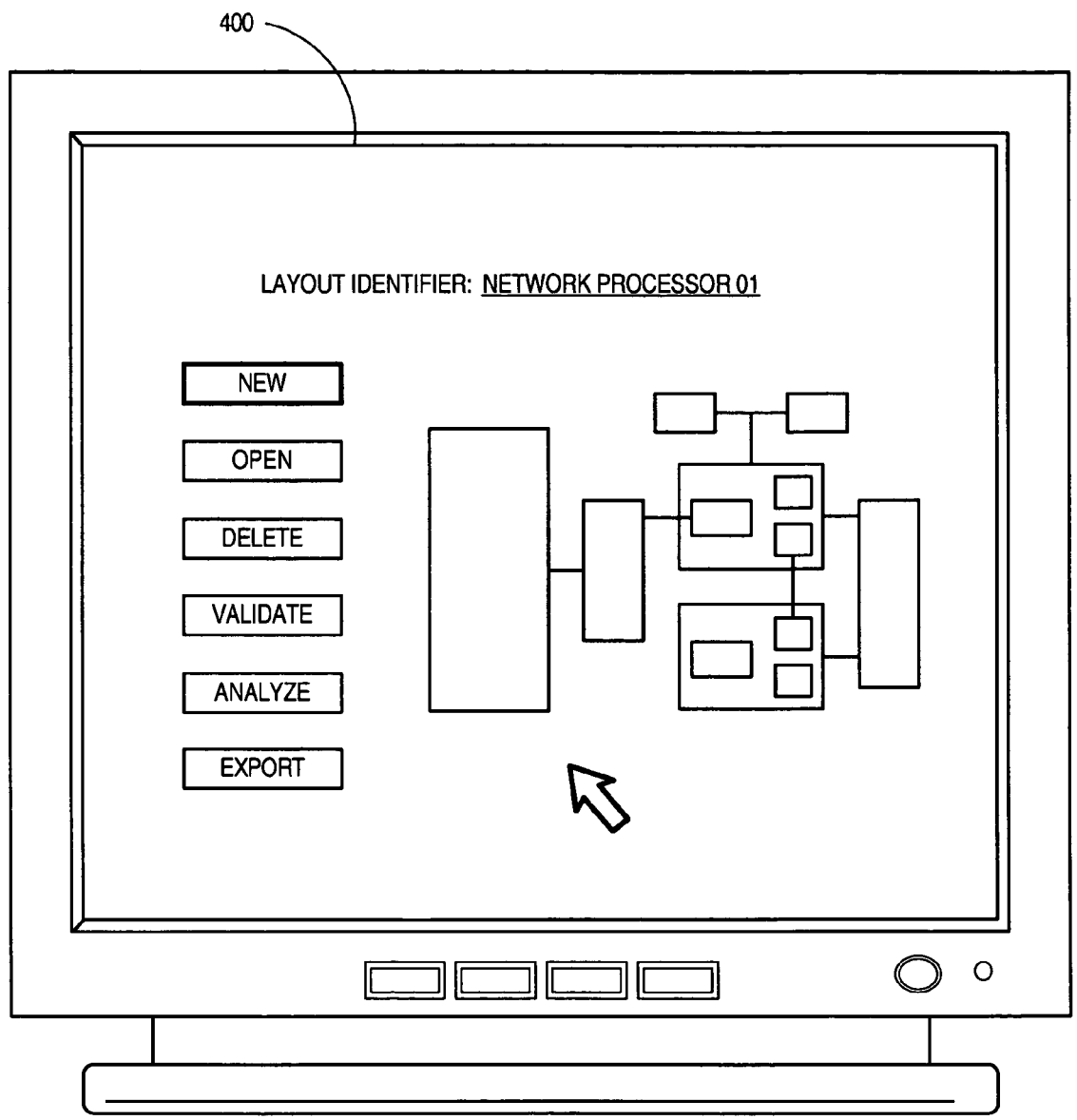
FIG. 4 illustrates a system display according to some embodiments.

FIG. 4 illustrates a system display 400 according to some embodiments. The system display 400 may be used, for example, by a system architect to create a new layout ("NEW"), to open an existing layout ("OPEN"), and/or to delete a layout ("DELETE").

According to some embodiments, the system display 400 may also be used to validate an existing layout ("VALIDATE"). Consider, for example, a connection defined between a processor and a memory unit. In this case, one or more interface parameters of the processor might be compared to corresponding interface parameters of the memory unit to determine if the connection is valid. For example, the connection might be determined to be invalid when the clock speeds of the two interface channels are different.

According to some embodiments, the system display 400 may also be used to analyze an existing layout ("ANALYZE"). For example, the layout information might be analyzed to estimate an amount of power that will be required (e.g., to power each of the processing components). As other examples, the layout information might be analyzed to determine a board area size, an overall processing speed, a failure rate (e.g., a mean-time-between failures), a processing system cost, and/or heat dissipation by components on the board.

According to some embodiments, the system display 400 may also be used to export layout information ("EXPORT") and/or to import layout information. For example, layout information might be exported in a format that is suitable for use by MIRCROSOFT® Word, Visio, PowerPoint or Excel.

Figure 5:
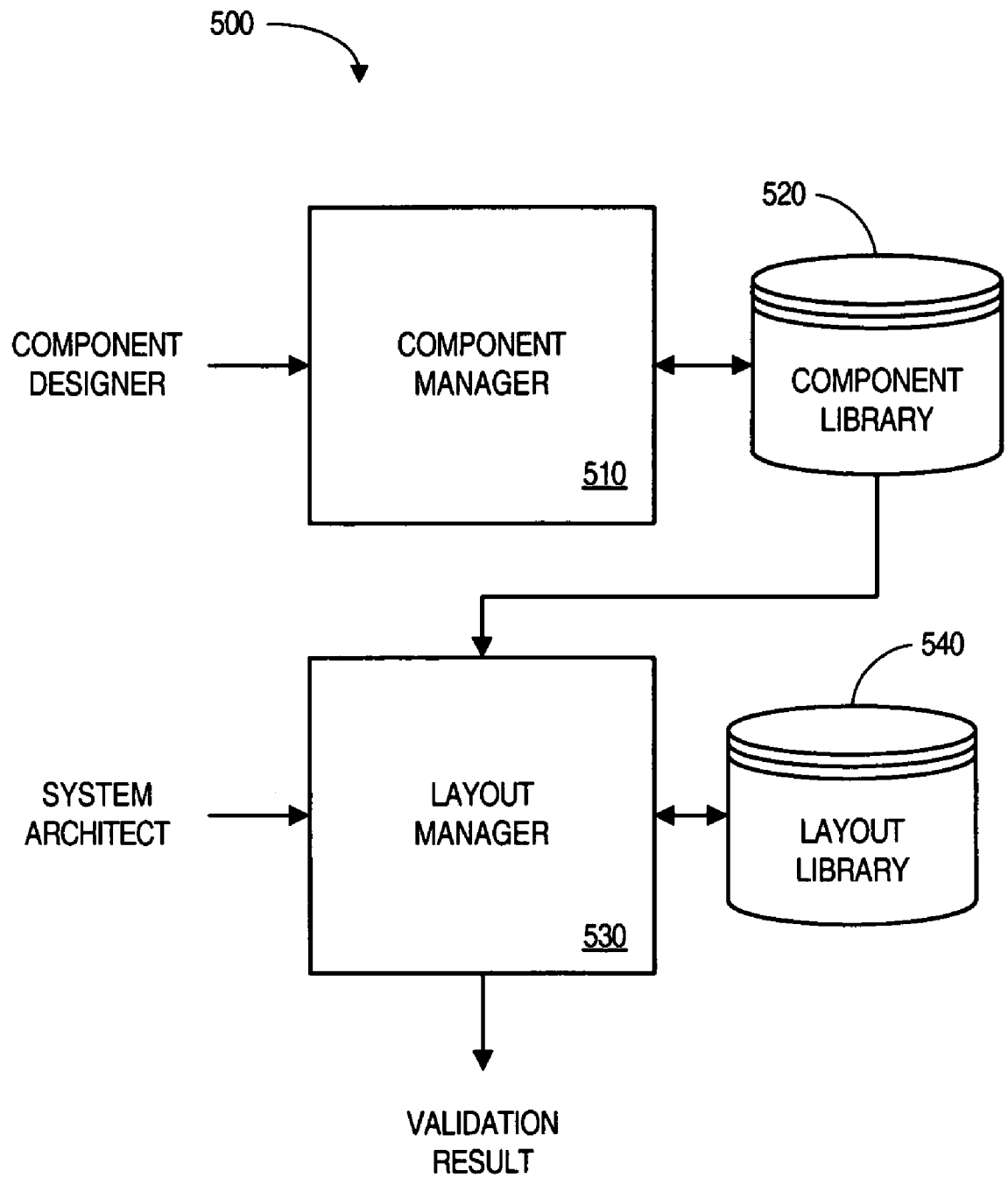
FIG. 5 is a block diagram of an apparatus according to some embodiments.

FIG. 5 is a block diagram of an apparatus 500 according to some embodiments. The apparatus includes a component manager 510 that receives information from a component designer and stores information into a component library 520 (e.g., stored on a hard disk drive). According to some embodiments, the component manager 510 may also import information from another system (e.g., an automated component design system).

A layout manager 530 receives information from a system architect (e.g., via a GUI) and retrieves information from the component library 520 (e.g., when the architect adds a new component to a layout). The layout manager 530 may also store information into, and retrieve information from, a layout library 540. Based on the connections defined between components and the information about those components in the component library 520, the layout manager 530 generates a validation result (e.g., listing the errors that were discovered in the layout along with how those errors might be corrected). For example, a validation engine (e.g., a software application) in the layout manager 530 might compare interface parameters to make such a determination.

Figure 6:
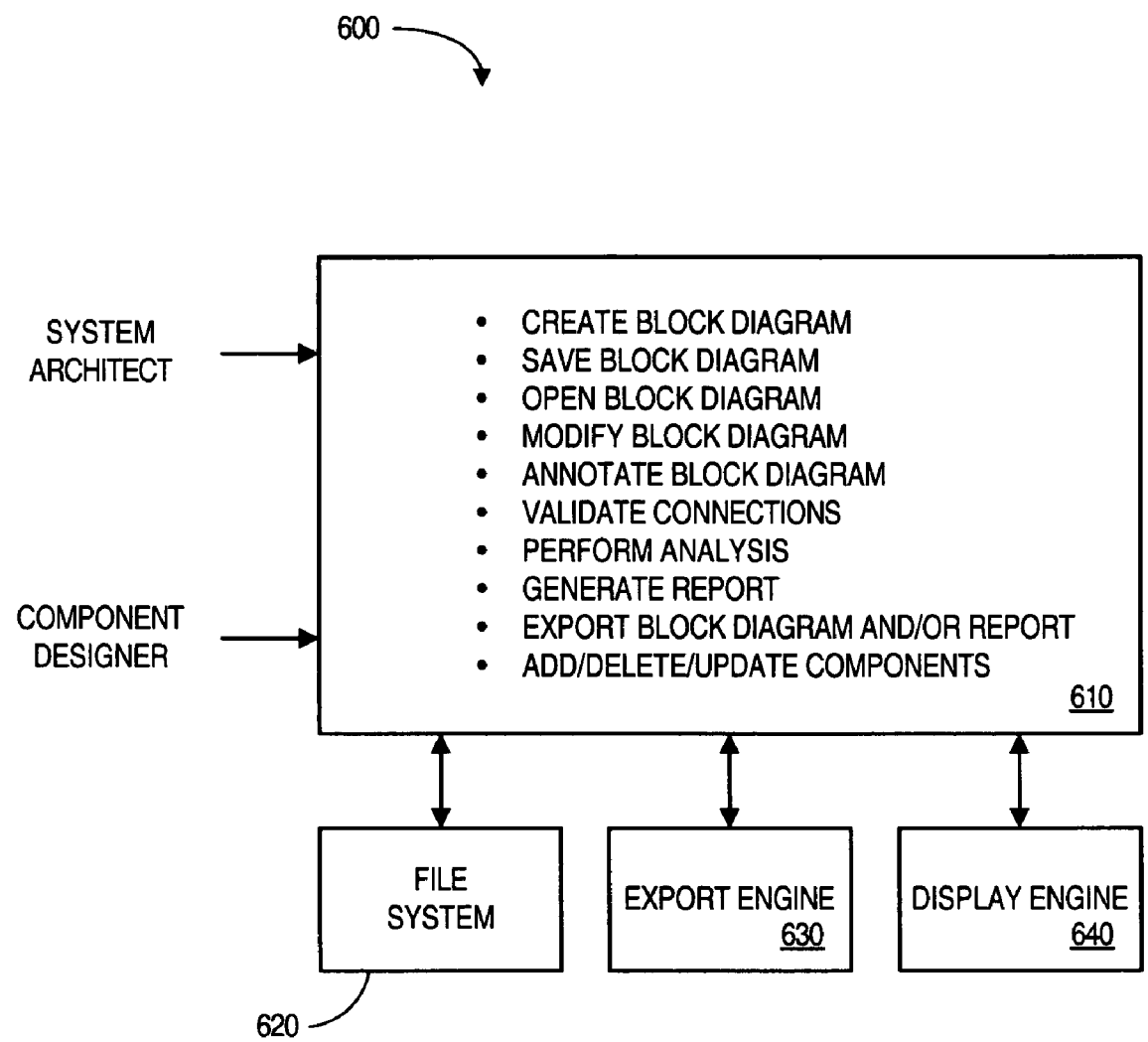
FIG. 6 is a block diagram illustrating system functions according to some embodiments.

FIG. 6 is a block diagram illustrating system functions 600 according to some embodiments. In particular, a main system 610 may receive information from a component designer and a system architect. The main system 610 may be used, for example, to generate, save, open and/or modify block diagrams (e.g., layouts).

According to some embodiments, the system architect may also annotate a block diagram. For example, he or she may add supplemental design notation text that will help others better understand and/or use the processing system design. The main system 610 may also handle the validation, analysis, reporting, importing, and exporting functions as well as the adding, deleting, and updating of components.

A file system 620 may exchange information with the main system 610, for example, when component or layout information is being saved or retrieved. An export engine 630 may, for example, provide an interface between the main system 610 and another software application (e.g., Adobe Acrobat) or hardware device. A display engine 640 may exchange information, for example, to facilitate interactions with an Operating System (OS) and/or the use of a GUI display via a computer monitor.

Figure 7:
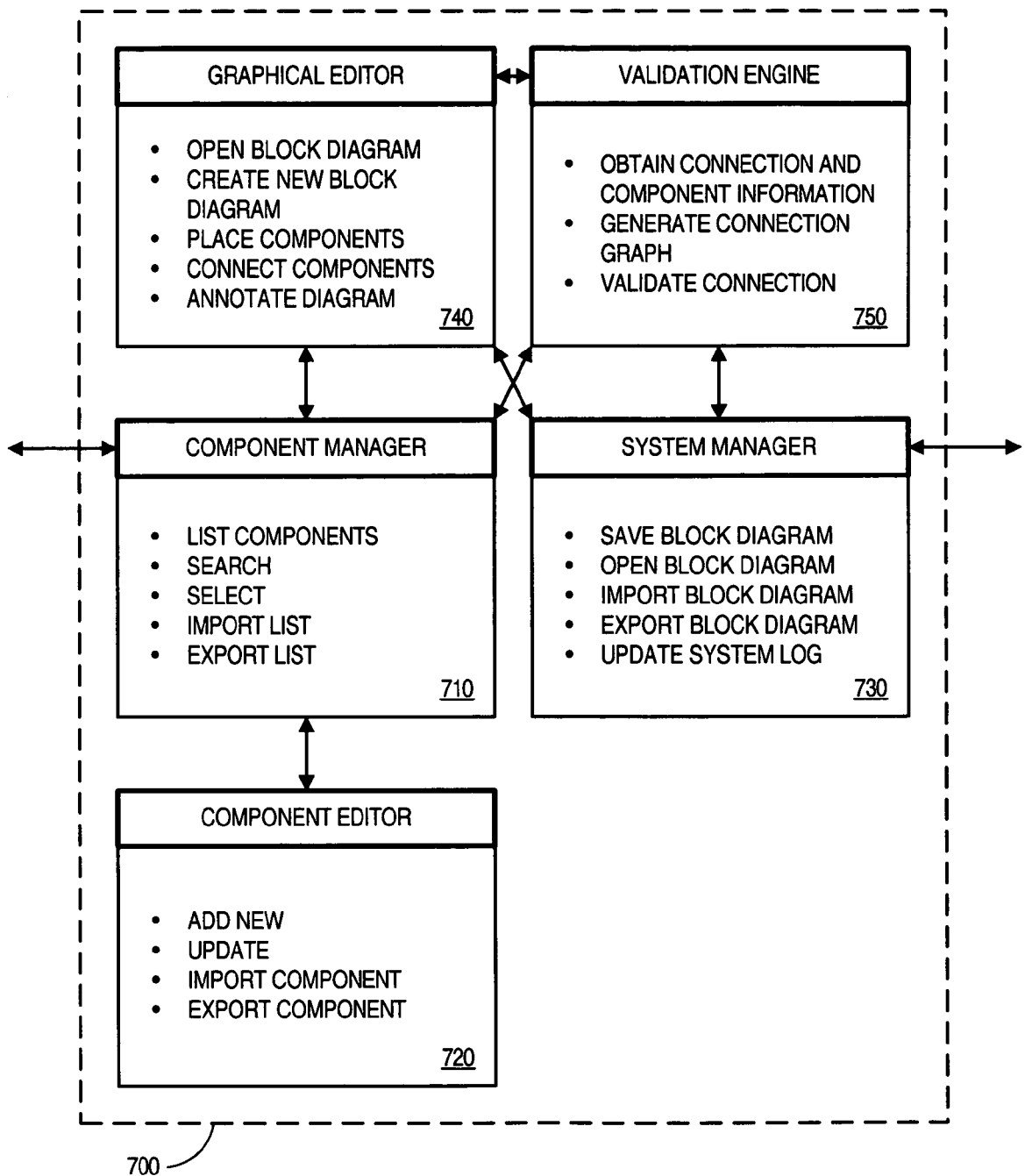
FIG. 7 is a block diagram illustrating system interfaces according to some embodiments.

FIG. 7 is a block diagram illustrating system interfaces 700 according to some embodiments. A component manager 710 may be accessed by a component designer who can list, search, and/or select components. The component manager 710 may also exchange information with a component editor 720 as component information is added, updated, imported and/or exported.

A system manager 730 may be accessed by a system architect who can save, open, import, export, and/or update layout information. According to some embodiments, the component manager 710 and/or system manager 730 may exchange information with a graphical editor 740 to help create or open block diagrams (e.g., by displaying and receiving layout information), to place and connect components, and/or to annotate a block diagram (e.g., by adding explanatory text).

A validation engine 750 may retrieve connection and component information, generate a connection graph, and/or validate the layout information provided by the system architect. According to some embodiments, errors are reported from the validation engine 750 to the system manager 730 to be stored in a system log.

Figure 8:
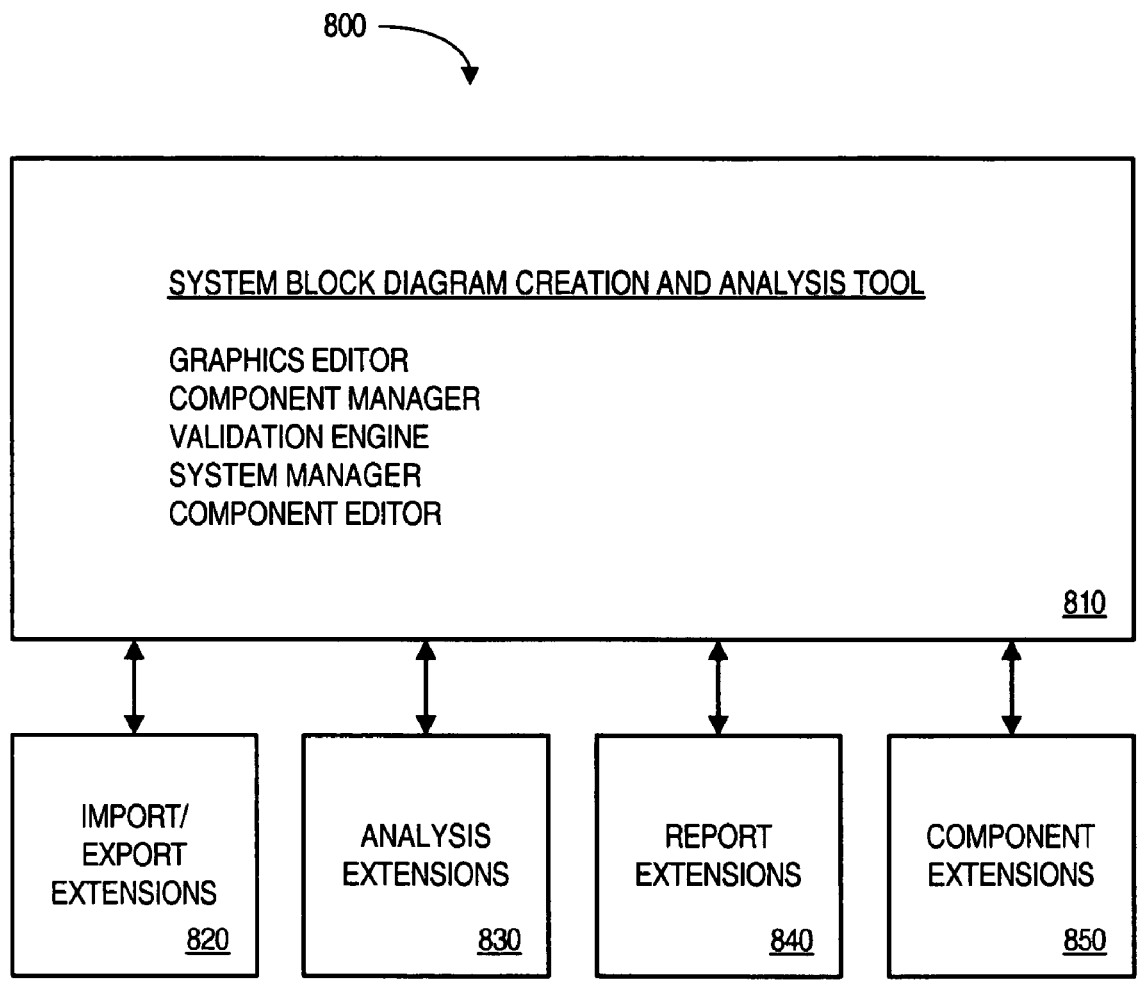
FIG. 8 is a block diagram illustrating system extensions according to some embodiments.

Although particular types of functionality have been described herein, according to some embodiments these and other functions may be extendable. For example, FIG. 8 is a block diagram illustrating extensions for a system 800 according to some embodiments. In particular a system block diagram creation and analysis tool 810 may interact with import and/or export extensions 820 so that new data formats may be support as the need arises. Similarly, analysis extensions 830 may be used to estimate new kinds of data (e.g., a new analysis extension 830 may be provided when the system architect determines that tool 810 should help select an appropriate conductor material and/or size for a connection). Similarly, report extensions 840 and component extensions 850 (e.g., associated with an extensible markup language) may be used to generate new types of reports and/or to define new types of components that may become helpful to a system architect and/or a component designer.

Figure 9:
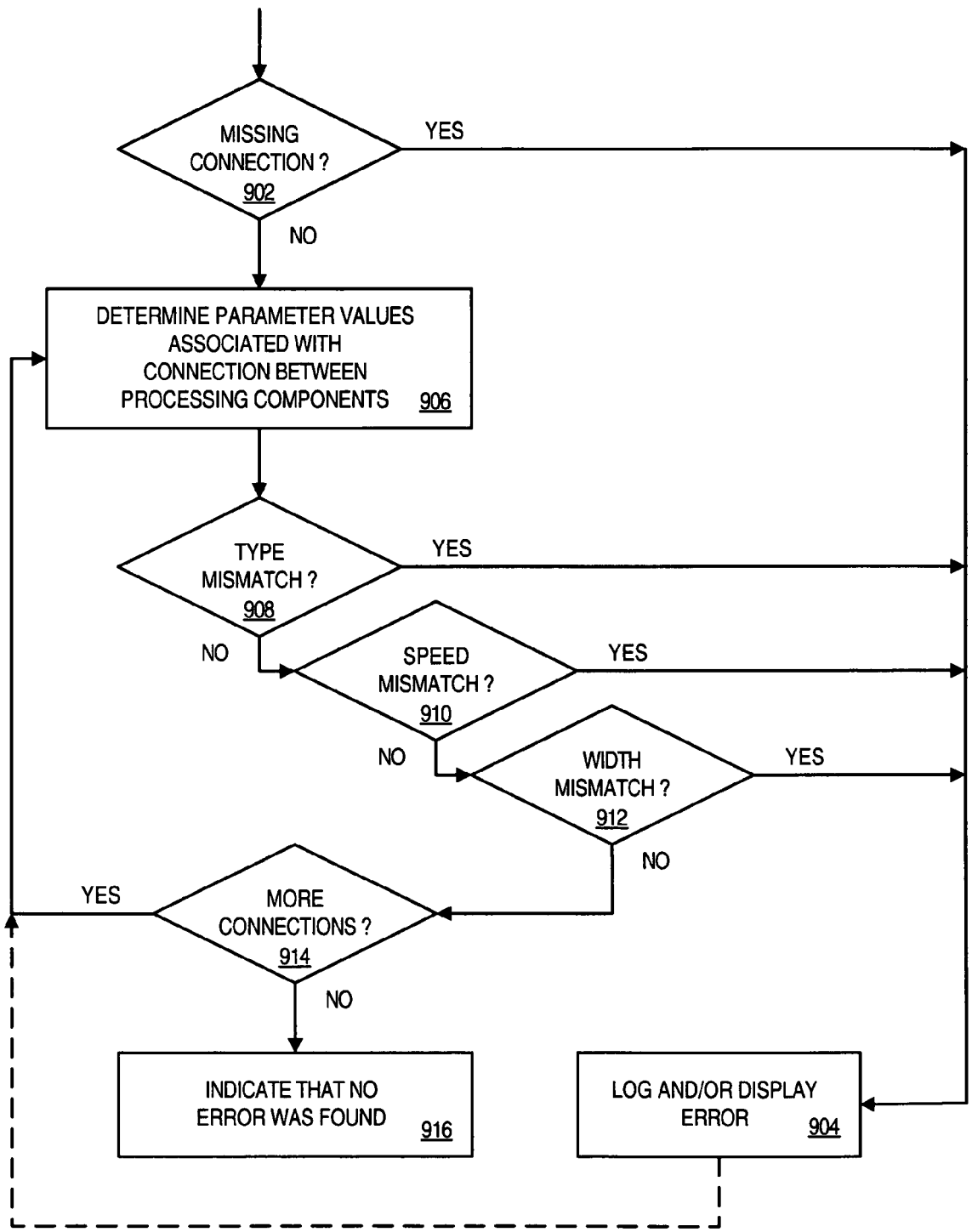
FIG. 9 is a flow chart of a method according to some embodiments.

FIG. 9 is a flow chart of a method according to some embodiments. The method might be performed, for example, by a validation engine in the layout manager 530 described with respect to FIG. 5. At 902, it is determined if any component interface has been left unconnected. If so, the error is logged and/or displayed to a system architect at 904. If not, parameter values associated with a connection between processing components are determined at 906 (e.g., by retrieving the information from a component database).

If there is a type mismatch at 908, the error is logged and/or displayed to a system architect at 904. For example, if a processor interface bus is inappropriately connected to a memory bus, the error may be logged.

If there is a speed mismatch at 910, the error is logged and/or displayed to a system architect at 904. For example, if a 2 MegaHertz (MHz) interface channel is coupled to a 3 MHz channel, the error may be logged. If there is a width mismatch at 912 (e.g., a 4-bit wide interface bus is coupled to a 6-bit wide interface bus), the error is logged and/or displayed to a system architect at 904. If it is determined at 914 that there are no more connections in the layout, the validation method ends and an indication is provided that no errors were found at 916.

According to some embodiments, the validation method stops when an error is encountered at 904. According to other embodiments, however, the validation method continues to evaluate other connections after an error is detected (e.g., as illustrated by the dashed arrow in FIG. 9). Moreover, according to some embodiments a validation may also suggest one or more adjustments that may correct an error (e.g., by suggesting that one component be replaced with another component).

Figure 10:
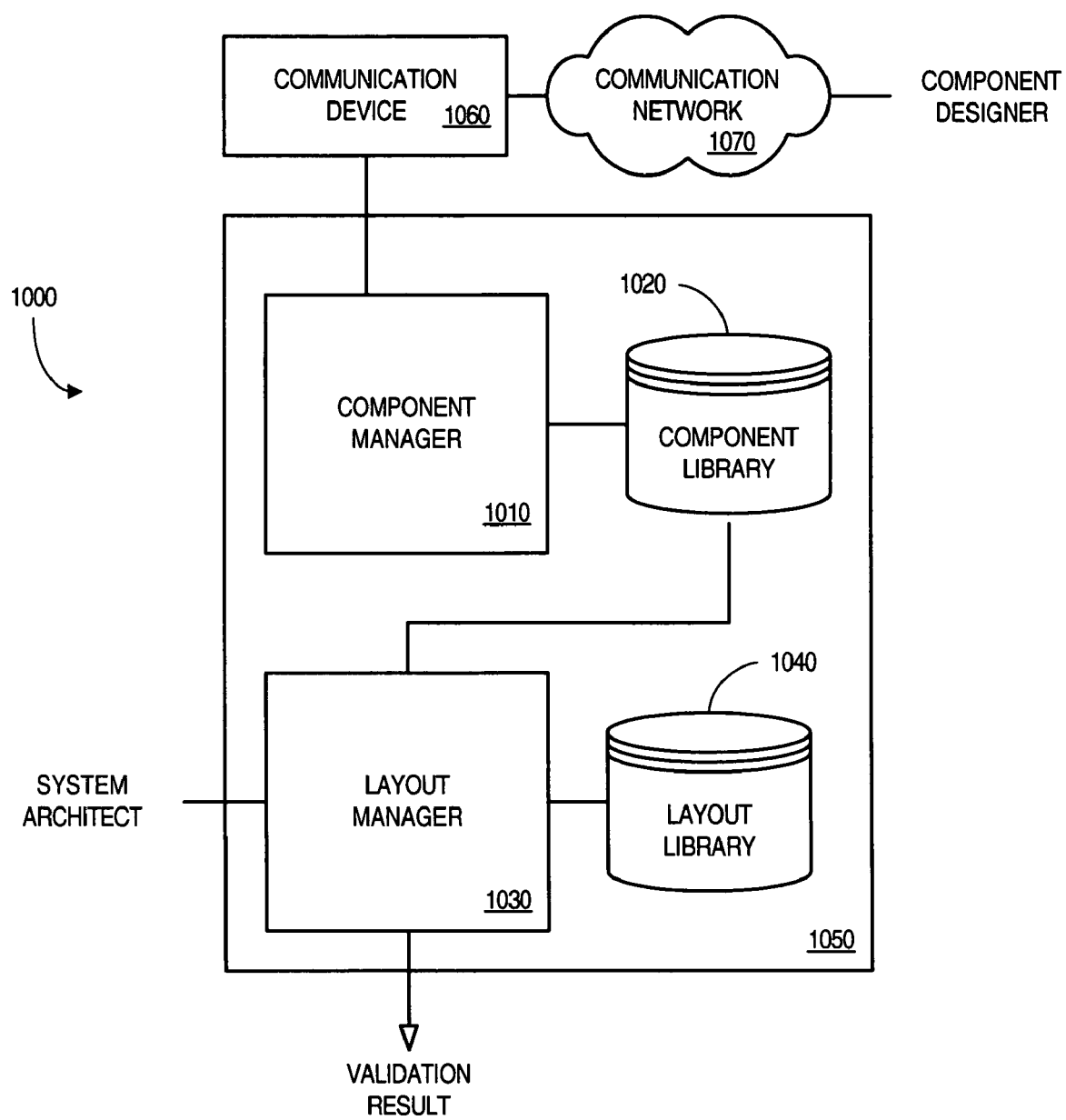
FIG. 10 is a block diagram of a system according to some embodiments.

FIG. 10 is a block diagram of a system 1000 according to some embodiments. The system 1000 includes an apparatus 1050 with a component manager 1010, a component library 1020, a layout manager 1030, and a layout library 1040. The apparatus 1050 may operate in accordance with any of the embodiments described herein. For example, the apparatus 1050 might perform some or all of the functions described with respect to FIG. 5.

According to this embodiment, the system 1000 also includes a communication device 1060 (e.g., a network interface device or modem) that may be used to exchange information between the apparatus 1050 and a remote component designer via a communication network 1070. By way of example, the component information might be exchanged using Hyper-Text Transfer Protocol (HTTP) information as defined by the Word Wide Web Consortium (W3C) RFC 2068 entitled "HTTP 1.1" (January 1997).

The several embodiments described herein are solely for the purpose of illustration. Persons skilled in the art will recognize from this description other embodiments may be practiced with modifications and alterations limited only by the claims.

What is claimed is:

1. A method, comprising:
receiving and retrieving component information associated with a plurality of separate computer processing hardware components, including multi-pin interface information associated with at least one of the computer processing hardware components;
receiving layout information via a graphical interface, the layout information including at least one connection between the computer processing hardware components; and
automatically determining if the layout information is appropriate based on the connection and the interface information.

2. The method of claim 1, wherein said receiving component information is associated with at least one of: (i) receiving the component information from a component designer, or (ii) retrieving the component information from a component database.

3. The method of claim 1, wherein said receiving layout information is associated with at least one of: (i) receiving the layout information from a system architect, or (ii) retrieving the layout information from a layout database.

4. The method of claim 1, wherein the interface information is associated with one of an interface channel or an interface bus.

5. The method of claim 4, wherein the interface information includes at least one of: (i) an interface identifier, (ii) an interface type, (iii) an interface speed, (ii) an interface direction, (iv) an interface width, (v) interface load information, or (vi) mode information.

6. The method of claim 4, wherein the interface information includes: (i) an interface identifier, (ii) an interface type, (iii) an interface speed, (iv) an interface direction, and (iv) an interface width.

7. The method of claim 1, wherein the interface information includes an interface type associated with at least one of: (i) a static random access memory interface, (ii) a quad data rate static random access memory interface, (iii) a dynamic random access memory interface, (iv) a double data rate dynamic random access memory interface, (v) a Rambus dynamic random access memory interface, (vi) a peripheral component interconnect interface, (vii) a peripheral component interconnect X interface, (viii) a peripheral component interconnect express interface, (ix) a peripheral component interconnect express advanced switching interface, (x) a common switch interface, (xi) a front side bus, (xii) a system packet interface 3, or (xiii) a system packet interface 4.

8. The method of claim 1, wherein at least one component is one of: (i) a memory unit, (ii) a switch fabric interface, (iii) a network processor, (iv) an interface unit, (v) a custom unit, (vi) a framer, (vii) a layer 2 switch, (viii) a layer 3 switch, (xi) a content addressable memory device, (x) a ternary content addressable memory device, (xii) a sub-layout, (xiii) a chipset, (xiv) a general purpose processor, (xv) an application specific integrated circuit, or (xvi) a content addressable memory unit.

9. The method of claim 1, wherein the component information further includes at least one of: (i) a component identifier, (ii) a component type, (iii) a silicon type, (iv) a clock frequency, or (v) annotation information.

10. The method of claim 1, wherein the layout information further includes at least one of: (i) a layout identifier, (ii) a layout type, or (iii) a supplemental design notation.

11. The method of claim 1, wherein the automatic determination includes at least one of: (i) checking for an unconnected interface, or (ii) comparing an interface information parameter value associated with a first component with an interface information parameter value associated with a second component.

12. The method of claim 1, wherein the layout information is associated with one of: (i) a processor, (ii) a network processor, (iii) a processor blade, (iv) a switching engine, or (v) an optical device.

13. The method of claim 1, further comprising:
analyzing the layout information and associated component information to determine at least one of: (i) power information, (ii) board area information, (iii) processing speed, (iv) failure information, or (v) cost information.

14. The method of claim 1, further comprising:
receiving component information from a component designer; and
storing the component information.

15. The method of claim 14, wherein the component information is received via an extensible mark-up language.

16. The method of claim 15, wherein the extensible mark-up language supports a Boolean interface definition.

17. The method of claim 1, further comprising at least one of: (i) saving the layout information, (ii) opening the layout information, (iii) exporting the layout information, or (iv) modifying the layout information.

18. An article, comprising:
a storage medium having stored thereon instructions that when executed by a machine result in the following:
retrieve component information associated with a plurality of separate computer processing hardware components, including multi-pin interface information associated with at least one of the computer processing hardware components;
receive layout information from a system architect via a graphical interface, the layout information including at least one connection between the computer processing hardware components; and
automatically determine if the layout information is appropriate based on the connection and the interface information.

19. The article of claim 18, wherein the interface information includes at least one of: (i) an interface identifier, (ii) an interface type, (iii) an interface speed, (ii) an interface direction, (iv) an interface width, (v) interface load information, or (vi) mode information.

20. The article of claim 18, wherein the automatic determination includes at least one of: (i) checking for an unconnected interface, or (ii) comparing an interface information parameter value associated with a first component with an interface information parameter value associated with a second component.

21. An apparatus, comprising:
a storage device to store component information associated with a plurality of separate computer processing hardware components, including multi-pin interface information associated with at least one of the computer processing hardware components;
an input device to receive layout information from a system architect via a graphical interface, the layout information including at least one connection between the computer processing hardware components; and
a validation engine to automatically determine if the layout information is appropriate based on the connection and the interface information; and
retrieving the component information from a component database.

22. The apparatus of claim 21, wherein the interface information includes at least one of: (i) an interface identifier, (ii) an interface type, (iii) an interface speed, (ii) an interface direction, (iv) an interface width, (v) interface load information, or (vi) mode information.

23. The apparatus of claim 22, wherein the automatic determination includes at least one of: (i) checking for an unconnected interface, or (ii) comparing an interface information parameter value associated with a first component with an interface information parameter value associated with a second component.

24. A system, comprising:
a storage device to store component information associated with a plurality of separate computer processing hardware components, including multi-pin interface information associated with at least one of the computer processing hardware components;
an input device to receive layout information from a system architect via a graphical interface, the layout information including at least one connection between the computer processing hardware components;
a validation engine to automatically determine if the layout information is appropriate based on the connection and the interface information; and
a communication device to receive component information from a remote device via a communication network; and
retrieving the component information from a component database.

25. The system of claim 24, wherein the interface information includes at least one of: (i) an interface identifier, (ii) an interface type, (iii) an interface speed, (ii) an interface direction, (iv) an interface width, (v) interface load information, or (vi) mode information.

26. The system of claim 24, wherein the automatic determination includes at least one of: (i) checking for an unconnected interface, or (ii) comparing an interface information parameter value associated with a first component with an interface information parameter value associated with a second component.

* * * * *